United States Patent [19]

Hunt et al.

[11] 4,422,226

[45] Dec. 27, 1983

[54] PROCESS FOR PRODUCING CRYSTAL RESONATORS

[75] Inventors: Roger W. Hunt, Greensboro, N.C.; Brian T. Miller, Leland; Donald R. Schroeder, Sandwich, both of Ill.

[73] Assignee: CTS Corporation, Elkhart, Ind.

[21] Appl. No.: 422,574

[22] Filed: Sep. 24, 1982

Related U.S. Application Data

[62] Division of Ser. No. 177,983, Aug. 14, 1980, Pat. No. 4,371,078.

[51] Int. Cl.³ .............................................. H01L 41/22
[52] U.S. Cl. .................................. 29/25.35; 29/593; 29/759; 29/760; 29/854; 29/855
[58] Field of Search ................... 29/25.35, 25.42, 593, 29/759, 760, 854–856; 198/131; 206/328–332, 486; 118/500

[56] References Cited

U.S. PATENT DOCUMENTS

3,799,535 3/1974 Baumann ........................... 29/760 X
4,049,118 9/1977 Honda et al. ....................... 206/330
4,306,343 12/1981 Rochat et al. ..................... 29/25.35

*Primary Examiner*—Carl E. Hall
*Attorney, Agent, or Firm*—Larry J. Palguta; John A. Young

[57] ABSTRACT

A pallet (10) for receiving a plurality of electrical components used in fabricating crystal resonators (28, 40, 42, 46), has a number of spaced bosses (12) adapted to receive terminals (30, 32) of the components. The terminals (30, 32) extend through a longitudinal groove (20) so that the components can be readily tested at various phases of assembly. The pallet (10) includes a number of spaced teeth (22) whereby the pallet (10), together with the components, can be advanced through a plurality of testing-and-fabricating stations. The pallet (10) is guided in its longitudinal intermittent movement by means of a keyway (26) constructed integrally in a face of the pallet opposite the side having the teeth (22). The pallet (10), together with the components mounted thereon, can be transferred from one fabricating station to the other through a rack (56) which is adapted to receive a number of pallets (10). In this manner the pallets (10) and components are moved through a curing oven, a frequency adjusting station (120), a vacuum bake-off chamber (62), and finally an encapsulating station (150). This enables minimal individual handling of the component as the unit is assembled. Consequently, the process can proceed much more rapidly and produce a more reliable end product because the ability to assemble and test the components at each stage of operation, including the frequency adjustment station, ensures a final product of high quality. The invention further includes suitable apparatus for practicing and carrying out the process as described.

10 Claims, 15 Drawing Figures

PROCESS FOR PRODUCING CRYSTAL RESONATORS

This is a division of application Ser. No. 177,983, filed Aug. 14, 1980 now U.S. Pat. No. 4,371,078.

DESCRIPTION

1. Technical Field

The present invention concerns the fabrication of electrical components such as crystal resonators. The technique of manufacturing the crystal resonator includes a means for mounting a number of starting components to which are added additional components in successive subassembly for testing and fabrication stations. The technical field is the manufacture, testing and production of electrical components including but not limited to crystal resonators, resistors, capacitors, etc. The crystal resonators in this case may consist of piezoelectric quartz crystal resonators having the final frequency adjusted by the selective deposition of precious metal onto the surfaces of the crystal.

2. Background Art

It has been well known to individually assemble and test crystal resonators by manually placing the resonators on testing fixtures and manufacturing fixtures, and then performing the selected test or assembly. Individual handling of parts in the manufacture of resonators, capacitors, resistors, etc. has long been practiced in the art. The technique of material flow consists of individually matching crystal to base and thereafter moving the subassembly progressively through the additional manufacturing processes manually. The path and subassemblies are individually handled. This procedure is time consuming and causes damage to the sensitive elements making up the crystal resonator. By mounting the base and then building up the resonator on a pallet, manual handling procedures are minimized. Moving components on a pallet minimizes handling, maximizes storage density of components, streamlines the technique for assembly and obviates many of the damaging defects of wear and contamination which were previously associated with a now outmoded individual handling of the components.

DISCLOSURE OF INVENTION

A special pallet has a number of spaced apart bosses each with a pair of openings proportioned to receive the terminals of electrical components therein. Additional electrical component parts are then successively added and there is progressively produced from a succession of fabricating and testing stations the final product. The mounting pallet is adapted to move the components through the building stages. The subassemblies need not be individually handled but they can be transferred from one fabricating station to the next where individualized testing and fabricating operations occur. Thus, a plurality of electrical components are handled by simply moving the pallet with the associated components through the various stages of completion from one station to the next, obviating individual handling of the components. Since the components are small and are highly susceptible to damage by handling, the incidence of damage is reduced, the speed of handling is improved, and the accuracy of locating components from one station to the next is greatly enhanced. An apparatus and process for carrying out the fabricating and testing procedures with the associated novel pallet are accomplished in such manner that the steps of ultrasonic cleaning, bake-off vacuumizing to purge the surfaces of contaminants, and then ultimately encapsulating the electrical components, as for example a crystal, within a contamination-free chamber, are readily facilitated by this joint handling of a plurality of the components rather than individual handling thereof. The apparatus for carrying out the described process includes a magnetic chuck which is adapted for removal of the subassembly from the pallet, the electrical subassembly being then matched with a vibratory-emplaced cap which forms a jacket over the subassembly to make a complete device, as for example a crystal resonator. This ready handling of the elements of the crystal resonator constitutes an additional advance in the art.

The foregoing operations occur with minimal handling resulting in faster production and higher yield of quality piezoelectric crystal resonators.

BEST MODE FOR CARRYING OUT THE INVENTION

Figures 1, 2, 3:
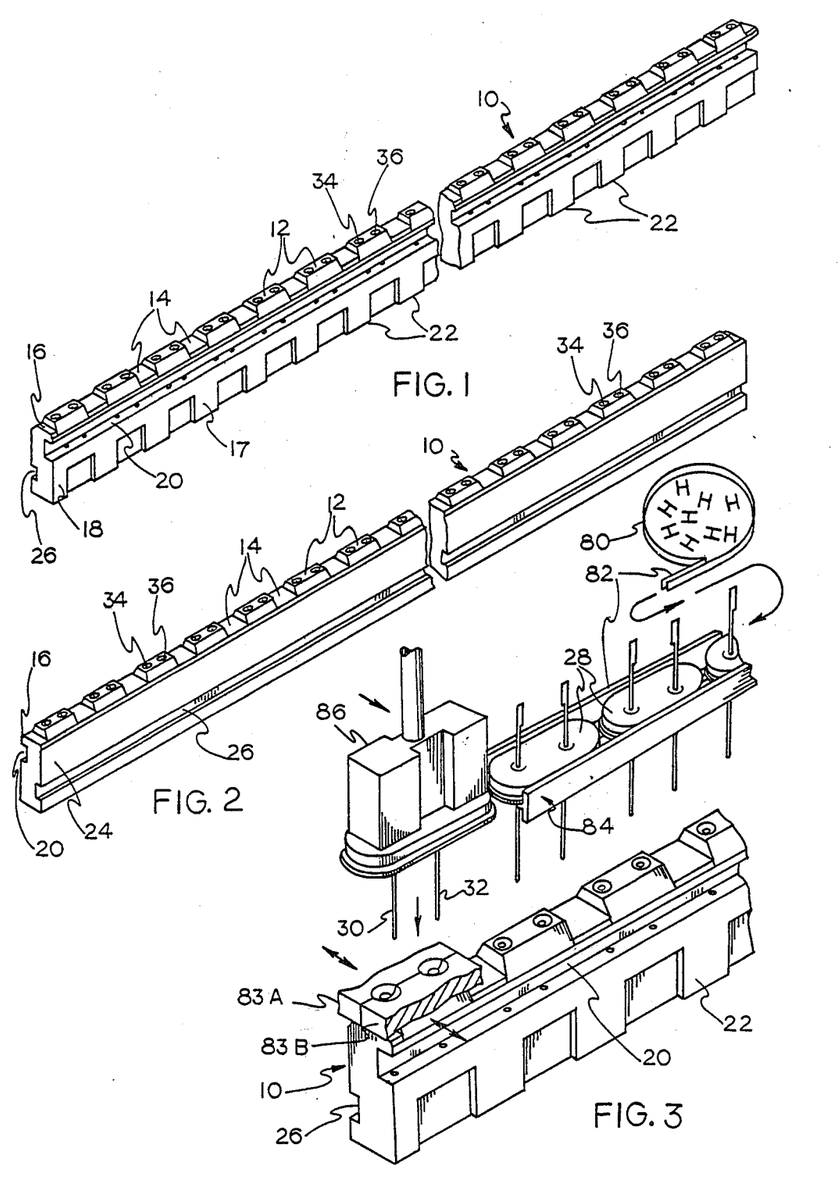
FIG. 1 is an isometric view of one side of the pallet.
FIG. 2 is an isometric view of the opposite side or face of the pallet.
FIG. 3 illustrates an exploded prospective view, the vibratory-bowl fed mounting of bases onto a pallet.

Referring now to the drawings and particularly to FIGS. 1 and 2, there is illustrated a pallet designated generally by reference numeral 10 which includes a number of regularly-spaced bosses 12 which are proportioned to receive the base of an electrical component thereon. In this description which follows, extensive reference to a crystal resonator will be made. It should be understood that this is illustrative of a particular unit but that the present disclosure is equally adapted to the manufacture of other devices such as capacitors, resistors, etc., all of which are well within the present invention as subject to fabrication by the described pallet, process and apparatus.

Each boss is separated by regular spacings or notches 14 which are constructed at end 16 of the pallet 10. Along one face 18 of the pallet is a longitudinal recess or groove 20 which is proportioned to permit therein a testing apparatus adopted to contact the terminals of the electrical component mounted on a respective boss 12. Along the lower end 17 of the pallet face 18 are a series of regularly-spaced rachet teeth 22 by which the pallet is advanced by regular increments through a processing or subassembly station whereby electrical elements mounted on the bosses are successively fabricated and tested.

Along the opposite pallet face 24 is a locating groove 26 which guides the longitudinal movement of the pallet and provides progressive slideable movement from one fabricating or testing station to the next.

While the dimensions of the pallet are not critical, it has been found convenient to construct the pallet approximately 15 inches long. Making the pallet longer does not produce proportional benefits and the longer the pallet, the more likely warpage might occur as the pallet is exposed to room temperature and then elevated temperature and back again, through the various fabricating steps.

The height of the pallet should be constructed in relation to the component being produced so that its terminals will extend through the groove 20 to be exposed. The exposed terminal sections enable testing of the electrical components by testing means inserted into the groove 20. The composition of the pallet ensures that it will not warp under heat and not exhibit outgassing which could be a source of contamination to the crystal. The pallet must also have sufficient strength, resilience and impact strength so that it will successfully resist the usual forces encountered during handling. Typically, the composition material is a glass-filled polyphenylene sulfide such as Ryton R-4, manufactured by Phillips Petroleum. It should be understood, however, that this is illustrative of only one acceptable material, and while glass-filled polyphenylene sulfide is satisfactory for the present invention, a particular composition is not critical to the present invention. Mention of this material is only for illustration.

The bosses 12 are proportioned so that the base component extends slightly longitudinally beyond the bosses in order to allow forks to enter the spacings between the bosses and facilitate lifting of the finished component out of its seated relation with the boss. A standard crystal size base which is utilized with the present invention is one identified as HC-18/U. Again, reference to a particular base should not be construed as critical but is only illustrative of the invention. It should be further understood that the boss is adapted for many different size bases, the only limiting factor being that the components must be able to be fitted within the general outline of the successive bosses. Generally speaking, a pallet is designed for a given size base, the bases in turn being adapted for a different crystal sizes. However, in the event the base changes, it is generally convenient to provide a different pallet designed for a particular base size.

PROCESS

Referring to FIGS. 3–13 and the flow diagram, FIG. 14, the method of testing and fabrication proceeds generally in the following manner. A base designated generally by a reference numeral 28 includes terminals 30, 32 positioned to fit within complementary openings 34, 36 in the boss 12. It should be noted that the openings extend through the entire height of the pallet 10 in order to contribute to the dimensional stability of the pallet. If the openings were of irregular length as they extended through the pallet, this might have a tendency to cause the pallet to be dimensionally unstable. Therefore, the openings 34, 36 extend through the bosses, continue past the longitudinal groove 20 and then through the remainder of the pallet.

Bases 28 are contained in a vibratory bowl feed mechanism 80 (FIG. 3) which operates to feed and position the bases into proper position within the chute 82. At the end 84 of the chute 82, a vacuum pick-and-place apparatus 86 picks up and positions each base 28 upon a boss 12 of the adjacent pallet 10, the pallet being moved intermittently as each positioning process is completed. A pair of die guides 83a and 83b are timed to move laterally together to form a die means for guiding the terminals 30, 32 into the openings 34, 36. The ratchet teeth 22 serve as a gripping surface for the apparatus 86 to advance the pallet in a step-wise manner in coordination with the insertion of the terminals 30, 32 into the openings 34, 36, respectively, and the positioning of the base 28 upon the boss 12 (step 200, FIG. 14).

Figure 4:
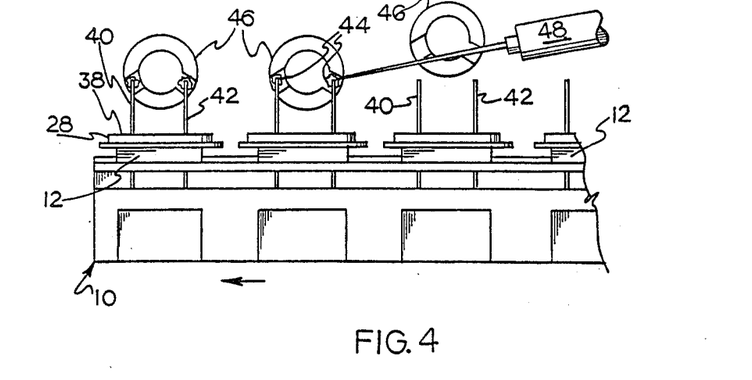
FIG. 4 is an isometric exploded view of the placing of the crystal onto the locating arms of the base and the application of the bonding material thereon.

As shown in FIG. 4, the base 28 includes a substantially rectangular foot 38 and two arcuate mounting arms 40, 42 on which is mounted a quartz crystal 46 and an adhesive 44 is deposited thereon, which may be in the form of a conductive epoxy material of any satisfactory composition.

Mounted between the arms 40, 42 is a circular quartz crystal 46 having a natural frequency. The fabrication procedure is initiated by disposing the base 28 on the upper surface of the boss 12 with the terminals 30, 32 inserted through the openings 34, 36 (FIG. 3). Each of the bosses 12 is so provided with a base. The quartz crystal 46 is then positioned between the arms 40, 42 (FIG. 4). There is then deposited bonding material on the arms 40, 42 by an ejector, illustrated schematically by reference numeral 48. The ejector has an outlet orifice and a quantity of adhesive contained within a variable volume compression chamber which is backed by a piston. When pressure is exerted on the piston, sufficient amount of the adhesive is ejected and directed by the outlet orifice onto a selected area of each arm and the crystal. The bonding material polymerizes and there is formed a mounting between the arms 40, 42 and the quarter crystal 46 (Step 202, FIG. 14). Next, a number of pallets 10 are mounted in a metal carrier 50 (FIG. 5 and step 204, FIG. 14) and the pallets together with their associated base-and-crystal subassemblies are inserted into a heating chamber (not shown) in which the epoxy is cured (step 206, FIG. 14) and the bonding made permanent between the crystal and the associated arms. The carrier 50 is a box-like metallic frame into which a number of pallets may be inserted by sliding such pallet into a slot 56. Each slot 56 has a rib 57 (FIG. 5A) positioned to receive either of the grooves 20, 26.

Figure 5:
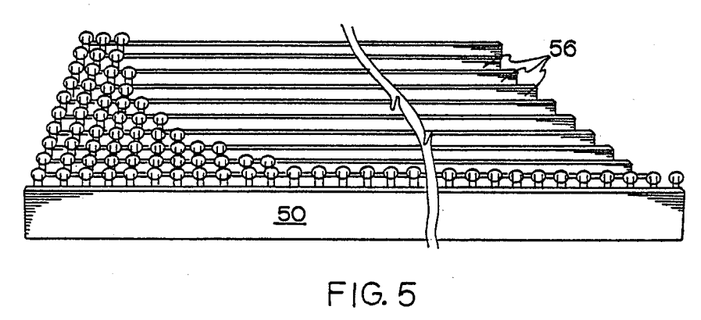
FIG. 5 illustrates the mounting of a number of palletized components into a rack preparatory to heat curing.
Figure 5A:
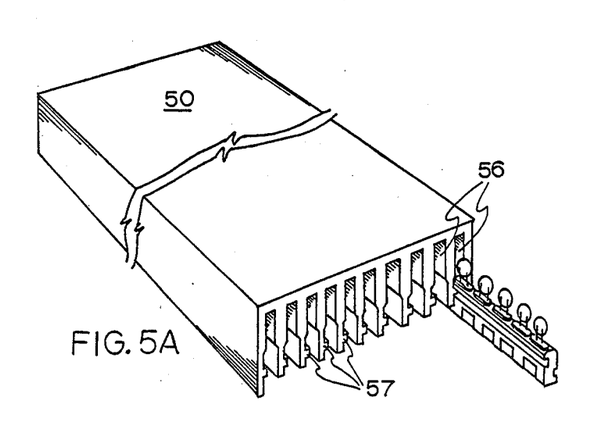
FIG. 5A illustrates the reverse mounting preparatory to the vacuum bake-off and encapsulation stations.
Figure 6:
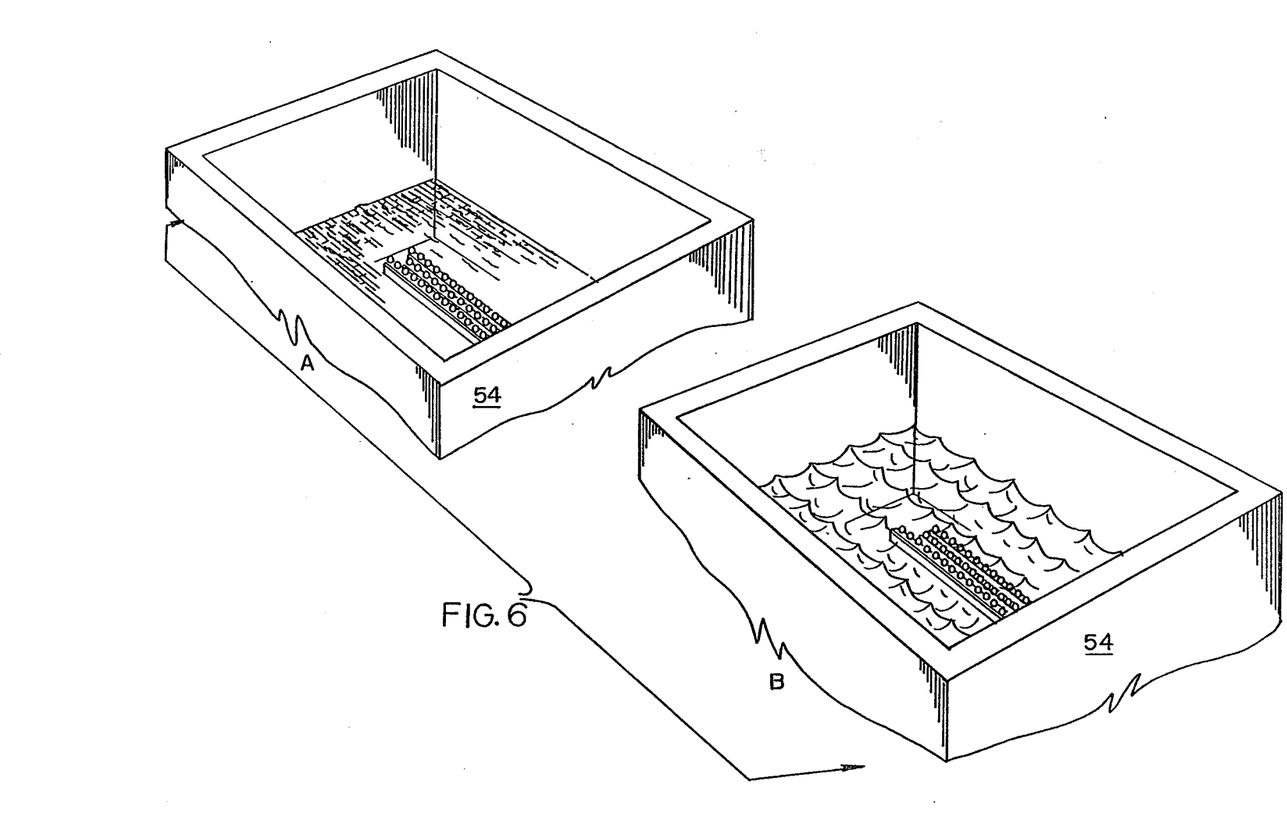
FIGS. 6A and 6B are isometric schematics view illustrating the ultrasonic cleaning of the surface of the crystal.

Thus, the pallets may be inserted within the slots 56 so that each mounted crystal 46 is disposed outside of the carrier 50, as shown in FIG. 5, and that volatiles may readily escape the epoxy 44 during curing. As shown in FIG. 5A, the carrier can be "flipped over" so that when each pallet is inserted into a slot 56, the base-and-crystal subassembly is contained within the slot. The containment of the crystals within the slots 56 is important in respect to the vacuum bake-off process and encapsulation process, steps 214, 216 respectively, of FIG. 14, as will hereinafter be described.

Figure 14:
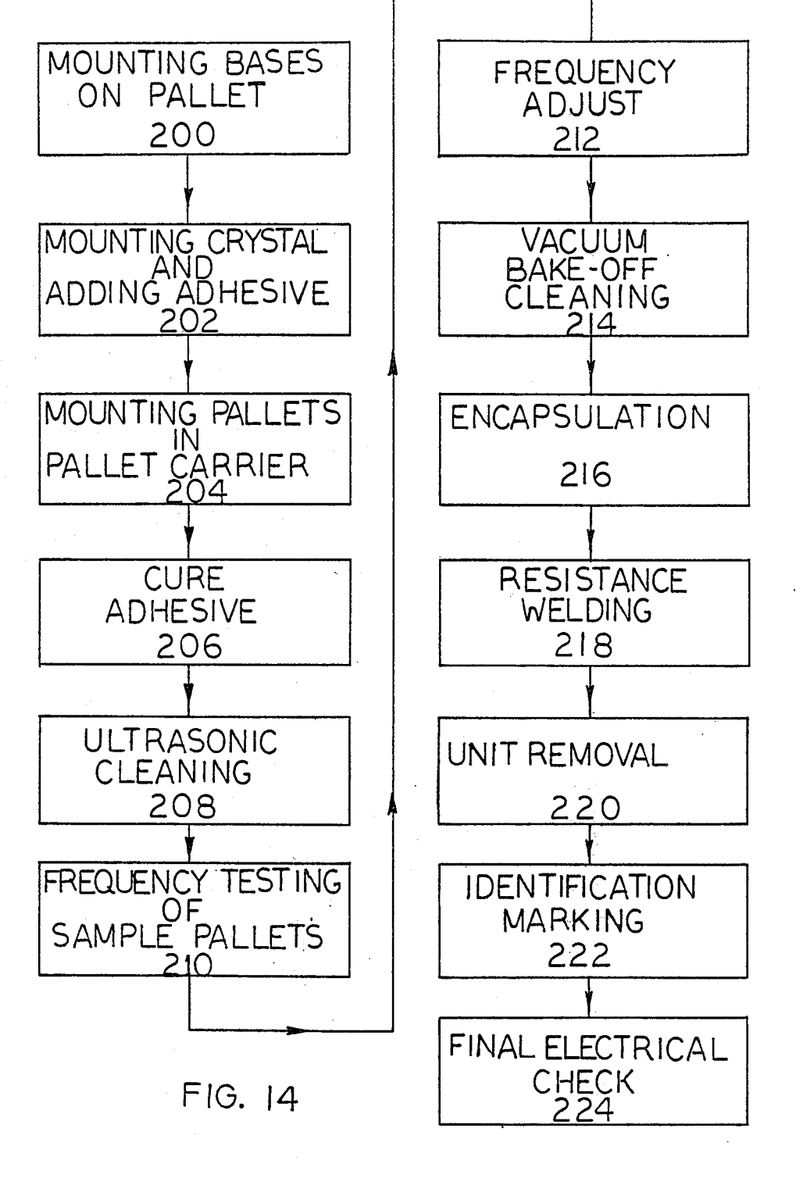
FIG. 14 is a block diagram illustrating the steps of the process as a whole.

Thereafter, the surfaces of the crystals are cleaned by means of an isopropyl alcohol wash (FIGS. 6A and 6B and step 208, FIG. 14). The pallets and crystals are jointly immersed in the alcohol of an ultrasonic cleaning tank 54, (FIG. 6A), and the washing medium is ultrasonically vibrated (FIG. 6B) during crystal immersion so that all contaminants are effectively removed from the surfaces of the crystal.

Figure 7:
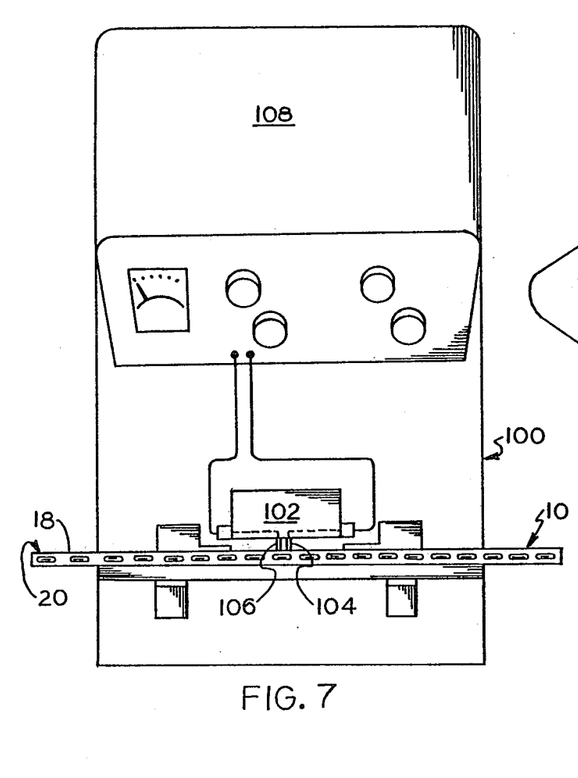
FIG. 7 illustrates schematically and in perspective view, the movement of the pallet through a testing station.

Next, some of the pallets and crystal subassemblies mounted thereon are fed through a testing station for a random check of the frequency and impedance of the crystals. This is primarily a sample testing procedure utilized for the maintenance of quality control. As shown in FIG. 7 and step 210 of FIG. 14, a randomly selected pallet 10 is fed through testing station 100. The groove 20 of face 18 is positioned inwardly toward contact apparatus 102. Terminal contacts 104, 106 move laterally toward the face 18 and reach inwardly of groove 20 to contact the terminals 30, 32. A current is passed through the terminal contacts, terminals and crystal, and the resonance frequency and impedance of the crystal is displayed by the metering device 108. The purpose of this random sampling station is to determine if the crystals meet basic quality control standards such that further fabrication of the resonators is justified, that is, defective or substandard units are removed from the fabrication process before further assembly and cost is expended.

Figure 8:
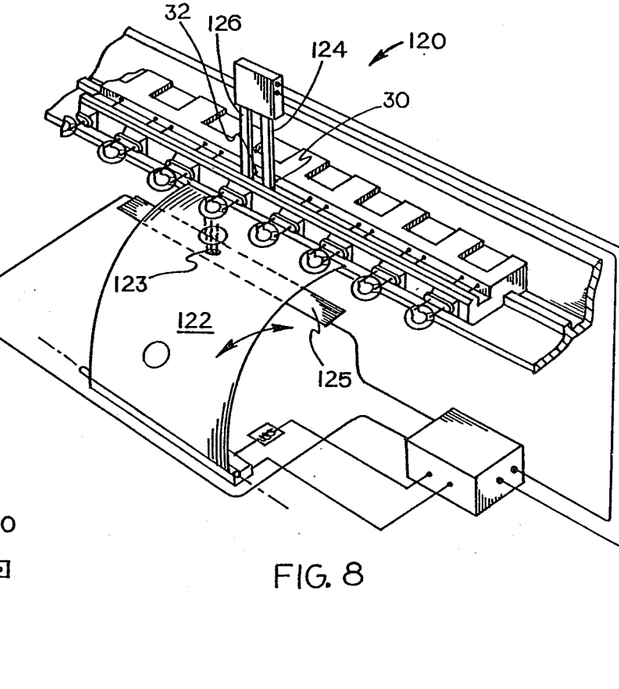
FIG. 8 illustrates in schematic perspective view the adjusting of the frequency of the crystal by selectively depositing precious metal onto the surface of the crystal through a vacuum deposition method.
Figure 9:
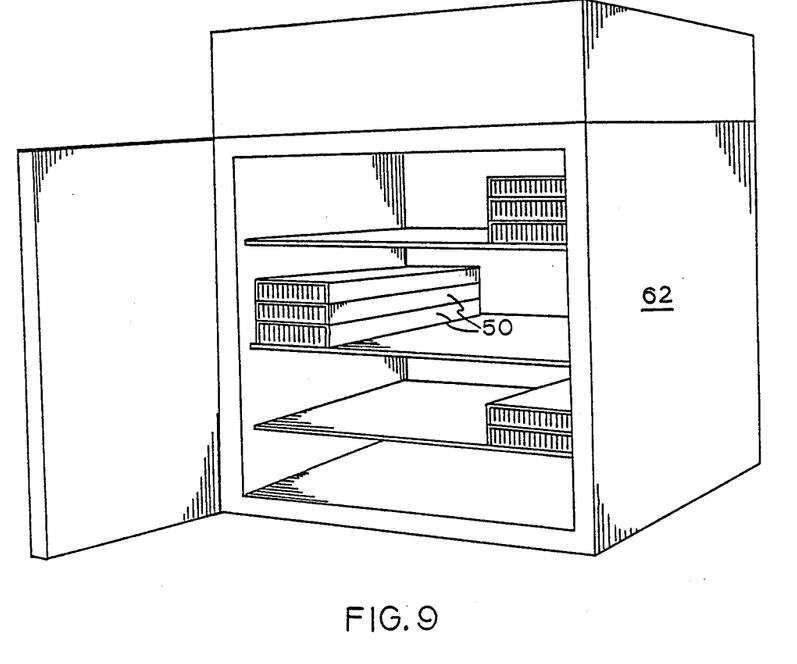
FIG. 9 illustrates vacuumized bake-off cleaning by removal of any volatiles, moisture or other contaminants from the surface of the crystal.

Referring now to FIG. 8 and Step 212 of FIG. 14, each crystal is then adjusted for a selected frequency by mounting the pallet onto an electronically controlled servo device which utilizes a standard vacuum deposition method well-known in the art. A particular preselected frequency is determined for that particular model crystal resonator. There is then deposited onto the face of the crystal, through the mask 122, a precious metal 123 such as gold or silver, which is heated by heating element 125, the plating chamber being illustrated schematically and referenced generally by numeral 120. The frequency output of the resonator is continuously measured during testing, the crystal receiving a current in the same manner as hereinbefore described. A pair of terminal contacts 124, 126 move downwardly to reach within the groove 20 and contact the terminals 30, 32. When the output frequency equals the calibrated frequency, the plating operation is automatically terminated by displacement of the mask 122. The metal used for coating the crystal consists of gold or silver placed on a heating filament, a method well-known in the art.

The incremental movement occurs by rachetting the pallet to bring successive quartz crystals into calibrating position. As soon as one crystal is calibrated, the calibration process is automatically terminated, and the pallet is again advanced by repeating the rachetting step to bring a succeeding crystal into the calibrating station for its adjustment. This procedure continues intermittently until all of the crystals on the pallet are calibrated in the manner described.

Using this adjusting technique, adjustment or calibration of the crystal is possible to a calibrated frequency only if the final calibrated frequency is less than the initial frequency of the crystal. While it is possible to achieve calibrated frequency by depositing precious metal onto the surface of the crystal to reduce the initial frequency to the final frequency, the reverse is not possible. Should the calibrated frequency be above that of the initial crystal frequency, some plating will occur but then the part will be rejected as defective. In the process so described, there are approximately one to two percent rejections which occur for the foregoing reason.

The pallet together with the now-adjusted crystals are next taken to a vacuum bake-off chamber 62 for removal of contaminants in preparation for final sealing of the crystal. The pallets are now mounted within the slots 56 of the carrier 50 as shown in FIG. 5A wherein the crystals 46 nested within the slots 56 and the carrier 50 stacked within the bake-off chamber 62. The vacuumizing bake-off chamber is illustrated generally by reference numeral 62 in FIG. 9 and comprises step 214 of FIG. 14. In the vacuum bake-off chamber, all residual moisture, together with any unpolymerized volatilizable ingredient from the bonding material is effectively removed. It has been found that if any of these contaminants remain within the sealed cover or jacket and deposit upon the crystal, it will have the effect of varying the oscillation response with time, a factor known as "aging". Since this is unsatisfactory, all such contaminants must be removed in order to provide a consistent oscillation response over the life of the resonator.

Figure 10:
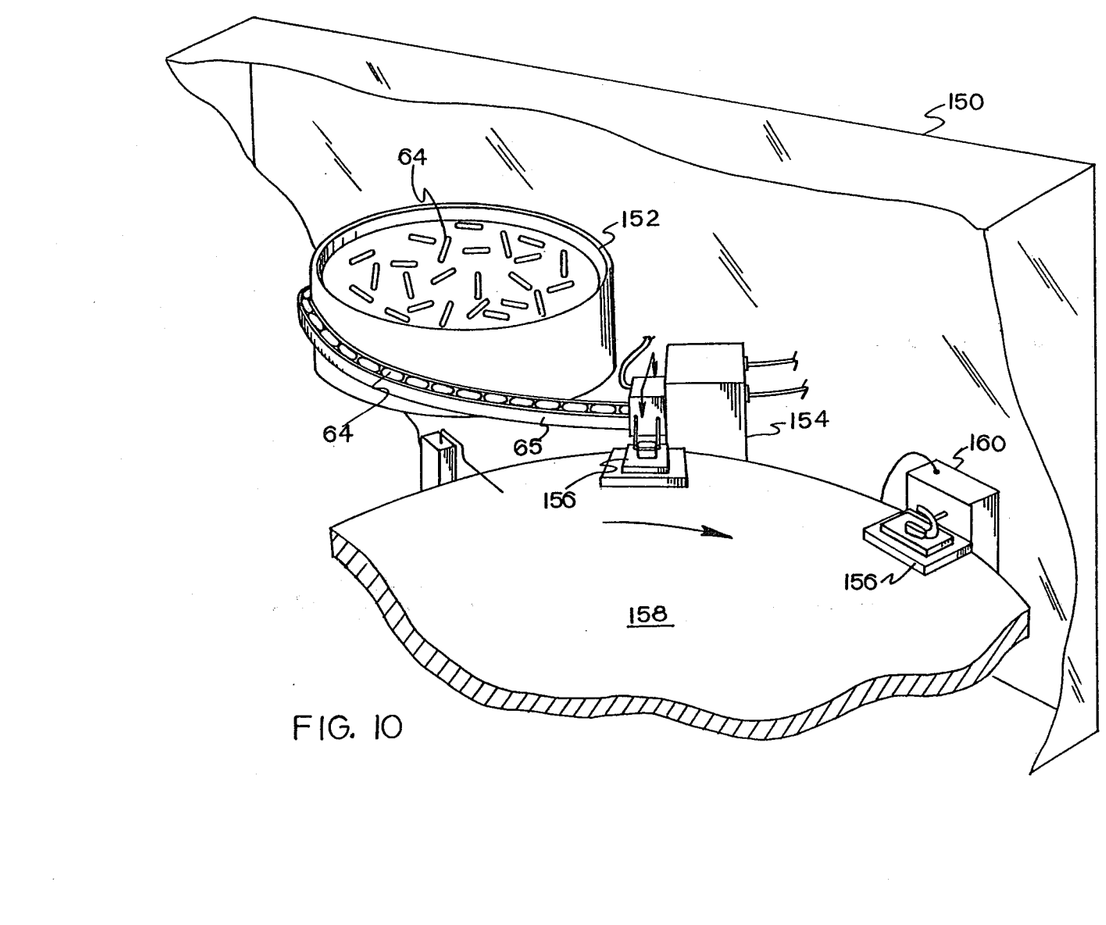
FIG. 10 illustrates the vibratory bowl feeding of the cover or jacket which is fitted over the crystal to form a protective chamber within which the crystal can operate without variation with aging.
Figure 11:
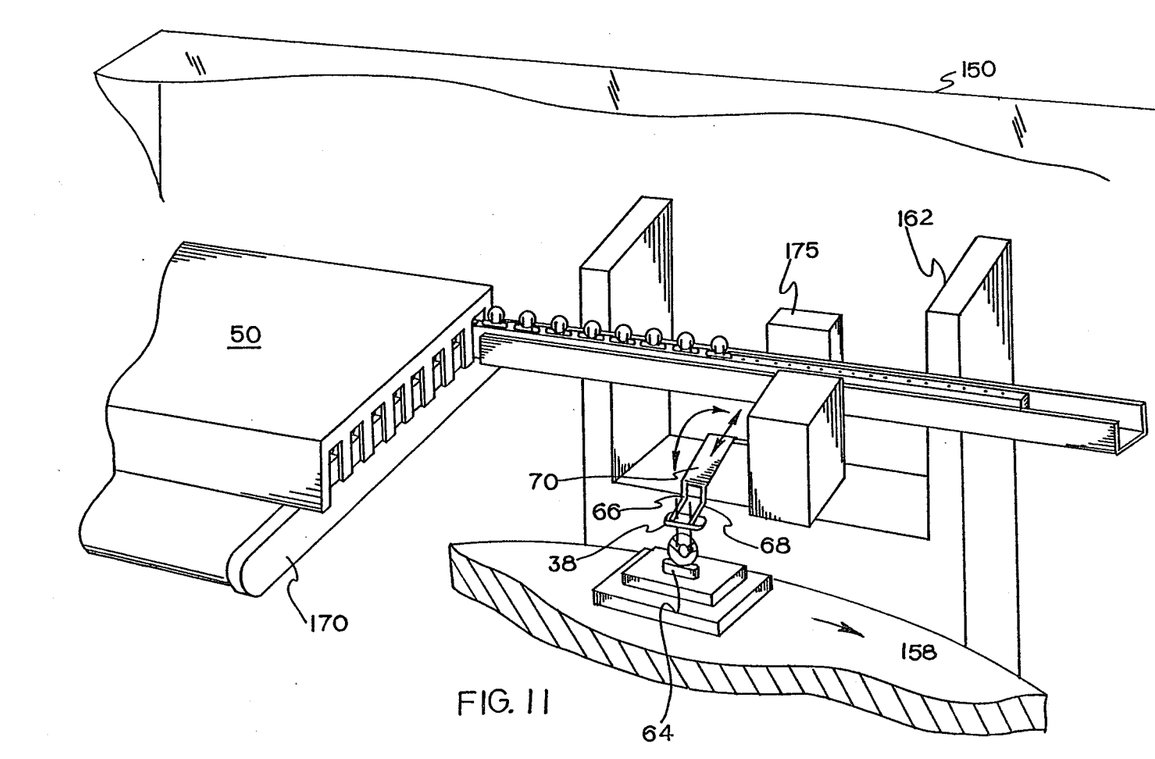
FIG. 11 is a view illustrating the forks effecting removal of the now-finished combination of the crystal-and-base by the chuck which then rotates the component through 180° for receiving the cover or jacket.

After vacuum baking, the carriers and pallets together with the calibrated-and-cleaned crystals are immediately transferred to a final assembly station in which a number of caps or covers 64 are provided for encapsulating the crystal. The slots 56 of the carrier 50 provide a protective enclosure to shield the cleaned crystals from contaminants and possible damage during the few seconds of transfer from the bake-off chamber to the final assembly station. The final assembly station comprises a nitrogen-protective chamber 150 wherein the encapsulation of the crystal, resistance welding, and removal of the unit occurs, FIGS. 10-12 and steps 216 through 220 of FIG. 14. As shown in FIG. 10, the covers 64 are continuously provided by a vibratory bowl feeder 152 in which causes a number of covers to decend through a helical feed track 65, the vibration causing the respective caps or covers 64 to be oriented in a given manner in preparation for the final assembly. Each cover 64 is placed by vacuum pick-off device 154 into a die receptacle 156 located on turntable 158. Turntable 158 is rotated clockwise approximately 60° to detection station 160 where a detection device determines whether or not a cap is properly located within the receptacle 156, while another cap 64 is placed within a receptacle 156 by the device 154. Station 160 is a microswitch with an extended arm that is tripped by a cap properly placed in the receptacle 156. The turntable again rotates clockwise 60° to position the cap 64 at the magnetic chuck station 162. As shown in FIG. 11, a metal carrier 50 is attached to lateral positioning device 170 which moves the carrier 50 laterally after a pallet has been withdrawn to thereby be in proper position for the withdrawal of another pallet. The pallets are successively withdrawn by the slide and ratchetting apparatus 175, and moved intermittently through the apparatus in conjunction with timed operation of the magnetic chuck 70.

The base-and-crystal subassemblies are extracted successively from the pallet by means of two tines 66, 68 of a magnetic chuck 70, which are proportioned to fit through the notches or spaces 14 adjoining each boss, and when raised, contact the undersurface of the foot 38 to lift and extract the base 28 and terminals 30, 32. The calibrated and cleaned crystal together with its base is lifted by the magnetic chuck 70 which rotates the combination through 180° until the foot 38 contacts and fits into the cover 64, the cover or jacket 64 then being disposed over the crystal and forming an interior chamber. The tines 66, 68 withdraw and rotate in the opposite direction to pick up the next positioned crystal-and-base subassembly while the turntable 158 rotates clockwise to position a successive receptacle positioned cap for reception of the next subassembly. The crystal-base-cap assembly is rotated step-wise in 60° increments to the resistance welding station 180, a welding and sealing technique well known in the art. Here the cap 64 is resistance welded to the base 28, which hermetically seals the cover or cap to the base. The resistance welding station 180 is illustrated schematically in FIG. 12 and comprises Step 218 of FIG. 14. After completion of the welding of the cover 64 to the base 28, the turntable rotates another 60° to position the crystal-base-cap assembly at unit removal station 183, shown schematically in FIG. 12 and consisting of Step 220 of FIG. 14. Here the crystal resonator unit 190 is mechanically removed by two pinchers 187, 188 which pick and lift the unit out of the die receptacle 156, move radially outward from the turntable 158, and deposit the unit into a disposal chute 189.

Figure 12:
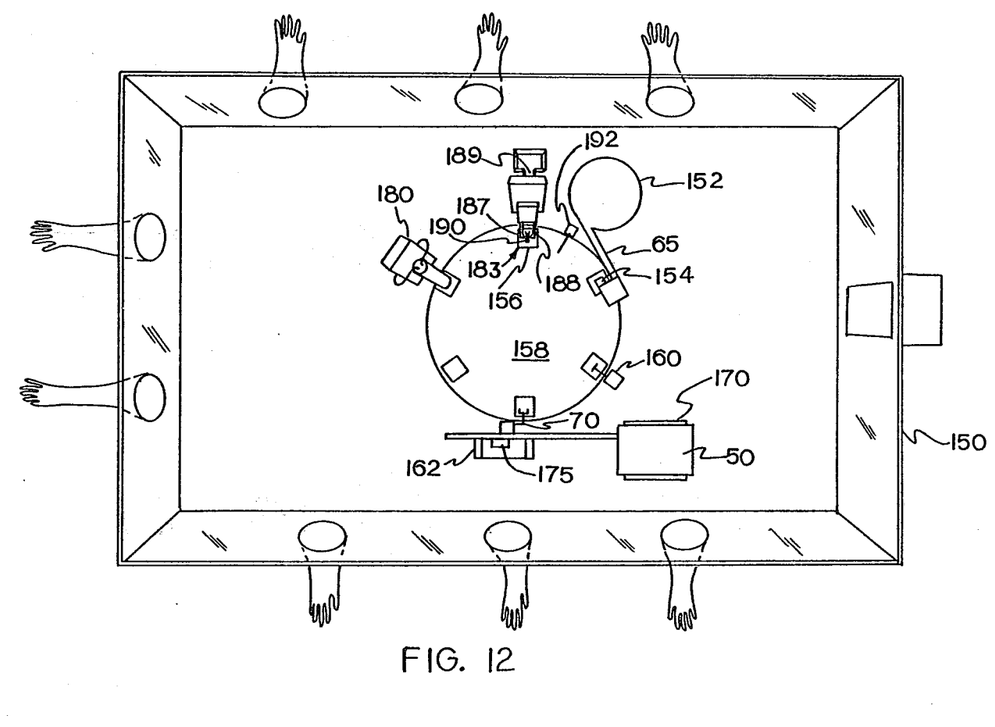
FIG. 12 illustrates the nitrogen-protective chamber wherein the encapsulation or sealing, resistive welding and unit removal occurs.
Figure 13:
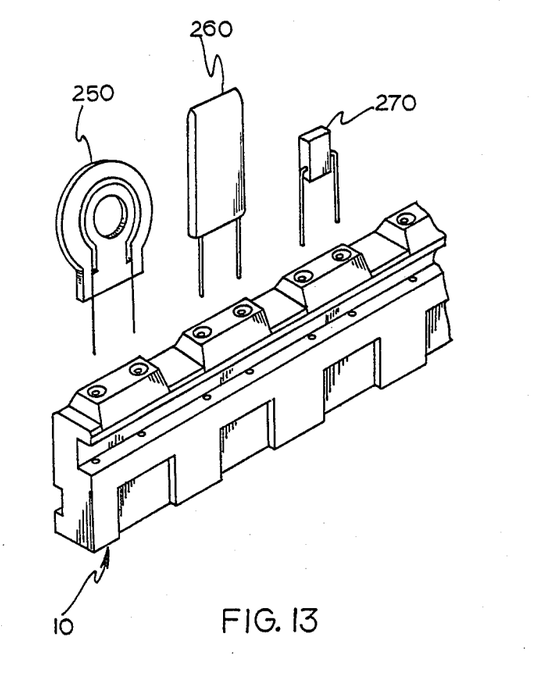
FIG. 13 illustrates in schematic form other electrical components including capacitors, resistors, etc. which can be selectively mounted onto the bosses formed along the edge of the pallet.

The turntable 158 then rotates another 60° by detection station 192 which determines that the crystal-base-cap assembly has been removed, so that the die receptacle 156 is ready for the insertion of a cap 64 by the pick-off device 154 when the turntable rotates another 60°. Station 192 comprises a microswitch which would be tripped by terminals 30, 32 if unit 190 was still positioned within the die receptacle 156.

Since the chamber 150 is nitrogen-filled, the now hermetically-sealed nitrogen-filled crystal chamber formed by the jacket over the crystal precludes aging. Both the jacket (cover) and the base are cold rolled nickel plated steel, the two materials being resistance welded together to form a totally sealed interior chamber wherein the crystal is housed and is free to resonate at its calibrated frequency. Since only nitrogen gas is present within the crystal chamber, and there is no foreign gaseous contaminant, a natural vibration of the crystal occurs and is not subject to variations with age. Consequently, once the resonator is removed from the chamber 150, it will resonate consistently at the calibrated frequency.

APPARATUS

The apparatus for carrying out the described process and which utilizes the pallet of the type described, can vary, but typically, the apparatus consists of a series of chambers which have been so described, and which employ in addition to the magnetic chuck and vibratory supply for the cap, such additional components which may make it possible to automatically remove and displace the pallet together with its associated electrical components from one station to the next. While such automatic movements have not been described, they are contemplated as well within the teaching of the present invention. The apparatus for carrying out the disclosed process is particularly useful in the formation of resonators. It should be understood that the present invention can be utilized and adapted for making resistors, capacitors, multi-vibrators and other such electrical components as is evident from reference to FIG. 13. In making these additional electrical components, the procedure is essentially the same, i.e., the electrical component is positioned in relation to regularly-spaced bosses on the pallet so that the terminals will extend through the openings, and pass across the gap or groove which is formed longitudinally of the pallet. The purpose of this is so that there is ready access to the terminals for testing of the desired electrical properties and subsequent calibration if need be to the desired electrical response, i.e., the resistance or ohmic value in the case of a resistor 250, the frequency in the event of a multi-vibrator 260, or the micro-farads or farads in the case of a capacitor 270.

The apparatus, while part of the present invention, is readily changeable and adaptable to any permutation of steps as described. As indicated by steps 222 and 224 of FIG. 14, the assembled units 190 may be removed by unit removal station 183, replaced onto a pallet, and then proceed through an identification marking step 222 wherein the unit receives product and technical data markings, and then finally proceed through a final electrical check step 224 where again the electrical characteristics of the resonators are tested. These last two steps are well within the teachings of the present invention, and may also be utilized in conjunction with other prior fabrication steps whereby the pallet is utilized at each step, that is, the subassemblies are not removed from the pallet and the complete assembly of a unit is accomplished as the pallet proceeds through every step of the process. Also, it is not essential that the cleaning steps occur in the order stated. Any permutation of steps together with calibration can occur according to design preference. It should be understood that the order of the steps is not essential to the invention and is not critical. For example, calibration of frequency of the resonator can occur after all of the cleaning operations have occurred or intermediate the cleaning operations or indeed even before any of the cleaning operations. All of these variations are contemplated within the scope of the present invention.

INDUSTRIAL APPLICABILITY

A means for joint handling of a plurality of components and the manufacture and testing of such components to reduce handling requirements.

CONCLUSION

Although the present invention has been illustrated and described in connection with example embodiments, it will be understood that this is illustrative of the invention, and it is by no means restrictive thereof. It is reasonably to be expected that those skilled in the art can make numerous revisions and additions to the invention and it is intended that such revisions and additions will be included within the scope of the following claims as equivalents of the invention.

We claim:

1. A process for producing electrical components having a plurality of terminals, including the steps of mounting said components upon a pallet having a plurality of regularly spaced bosses and teeth means, each of said bosses including openings for receiving the terminals of the respective components, passing such terminals through a longitudinal groove of said pallet to provide access to respective pairs of said terminals for operations such as the individual testing of said components, mounting said pallet for longitudinal slideable guided movement, and thereafter advancing the pallet by means complementary with said teeth means engaging said teeth means to move the pallet, through a station in which one of said operations is completed as said components move through the station.

2. The process in accordance with claim 1, further comprising the steps of advancing said pallet through heat-treating and cleaning stations whereby the pallet and the electrical components mounted thereon are transferred and processed in unison.

3. The process in accordance with claim 2, including the step of individually removing the electrical components by inserting a removal tool within spaces provided between successive bosses whereby the components can be individually lifted out of seated relationship on their associated bosses.

4. The process in accordance with claim 3, wherein the electrical components formed are crystal resonators and including the preliminary steps of inserting the terminals of a base within the openings in one of said bosses, bonding a crystal onto resilient arcuate arms of said base, cleaning the surfaces of said crystal, adjusting the frequency response of said crystal by coating material onto the surface of said crystal, and thereafter encapsulating said crystal with a jacket and thereby forming a sealed enclosure over the crystal while enabling free vibration of said crystal within the enclosure defined by said jacket.

5. The process in accordance with claim 4, in which said jacket is welded to a portion of said base to form a hermetically sealed chamber.

6. The process in accordance with claim 4, in which said cleaning comprises ultrasonically washing the surfaces of said crystal to remove contamination therefrom.

7. The process in accordance with claim 2, including mounting a plurality of said pallets, each containing electrical components, on a carrier, and displacing said carrier in accordance with the respective processing steps whereby a plurality of components on the respective pallets are individually treated in position and are thereby transferred in unison.

8. The process in accordance with claim 4, in which prior to encapsulating said crystal, the crystal-and-base assembly are removed from the pallet, rotated approximately 180°, the assembly inserted into the interior of an encapsulating cover, and welding the cover onto the base to form a hermetically sealed and contamination-free chamber.

9. The process in accordance with claim 8, including the steps of orientating the cover by vibratory feed means, and matching the cover to a respective base-and-crystal assembly by means of a magnetic chuck.

10. The process in accordance with claim 1, wherein the operation comprises the engagement of testing means with terminals of the respective electrical components whereby the electrical components are singularly tested as said components move through the station.

* * * * *